(12) United States Patent
Shi et al.

(10) Patent No.: US 12,010,896 B2
(45) Date of Patent: Jun. 11, 2024

(54) DISPLAY DEVICE AND MANUFACTURING METHOD THEREOF

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Bo Shi, Beijing (CN); Weiyun Huang, Beijing (CN); Benlian Wang, Beijing (CN); Haigang Qing, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

(*) Notice: Subject to any disclaimer, the term of this patent is extended or adjusted under 35 U.S.C. 154(b) by 491 days.

(21) Appl. No.: 17/433,381

(22) PCT Filed: Feb. 25, 2021

(86) PCT No.: PCT/CN2021/077895
§ 371 (c)(1),
(2) Date: Aug. 24, 2021

(87) PCT Pub. No.: WO2022/178760
PCT Pub. Date: Sep. 1, 2022

(65) Prior Publication Data
US 2022/0399410 A1    Dec. 15, 2022

(51) Int. Cl.
*H10K 59/65*    (2023.01)
*H10K 50/86*    (2023.01)
*H10K 71/00*    (2023.01)

(52) U.S. Cl.
CPC .......... *H10K 59/65* (2023.02); *H10K 50/865* (2023.02); *H10K 71/00* (2023.02)

(58) Field of Classification Search
CPC ....... H10K 59/65; H10K 71/00; H10K 50/865
See application file for complete search history.

(56) References Cited

U.S. PATENT DOCUMENTS

2015/0192725 A1* 7/2015 Facke .................... G02B 6/005
                                                                    362/606
2016/0195760 A1* 7/2016 Cho .................. G02F 1/133512
                                                                    362/97.3

(Continued)

FOREIGN PATENT DOCUMENTS

CN        107025451 A    8/2017
CN        107480639 A    12/2017

(Continued)

*Primary Examiner* — Mohsen Ahmadi
(74) *Attorney, Agent, or Firm* — DINSMORE & SHOHL LLP

(57) ABSTRACT

The present disclosure provides a display device and a manufacturing method thereof. The display device includes an imaging area and a display area on at least one side of the imaging area. The imaging area includes: a substrate; an image collection device on a side of the substrate, the image collection device including a photosensitive element and an optical element; a light blocking layer on a side of the substrate away from the image collection device, wherein the light blocking layer includes at least one of a light absorbing layer or a diffuse reflection layer, and the light blocking layer is provided with a first gap; and a plurality of first electrodes on a side of the light blocking layer away from the substrate, wherein a second gap is provided between two adjacent first electrodes of the plurality of first electrodes.

10 Claims, 6 Drawing Sheets

(56) References Cited

U.S. PATENT DOCUMENTS

| | | | |
|---|---|---|---|
| 2017/0372113 A1 | 12/2017 | Zhang et al. | |
| 2019/0094575 A1* | 3/2019 | Wang | G02F 1/1326 |
| 2019/0101797 A1* | 4/2019 | Wang | G02F 1/134309 |
| 2020/0050065 A1* | 2/2020 | Zang | G02F 1/13394 |
| 2020/0075680 A1 | 3/2020 | Sun et al. | |
| 2020/0293739 A1* | 9/2020 | Yang | H10K 59/126 |
| 2020/0301187 A1 | 9/2020 | Lin et al. | |
| 2021/0202619 A1* | 7/2021 | Hu | G02F 1/155 |
| 2021/0215973 A1* | 7/2021 | Wang | G02F 1/133605 |
| 2021/0223440 A1 | 7/2021 | Wang et al. | |
| 2021/0333911 A1 | 10/2021 | Zhou | |

FOREIGN PATENT DOCUMENTS

| | | |
|---|---|---|
| CN | 109192759 A | 1/2019 |
| CN | 109817109 A | 5/2019 |
| CN | 110427123 A | 11/2019 |
| CN | 110767660 A | 2/2020 |
| CN | 111261684 A | 6/2020 |
| CN | 111312087 A | 6/2020 |
| CN | 111834413 A | 10/2020 |

\* cited by examiner

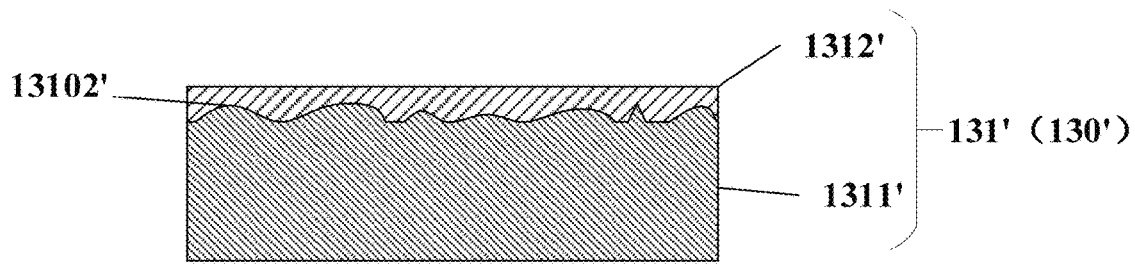
Fig. 3
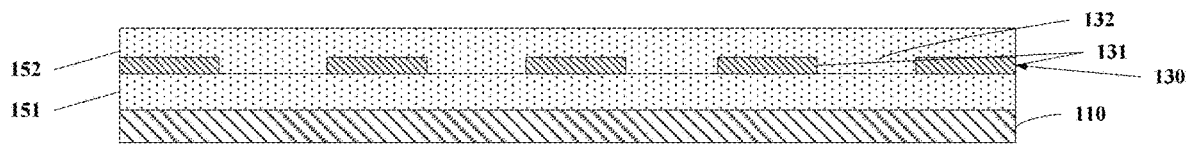
Fig. 4
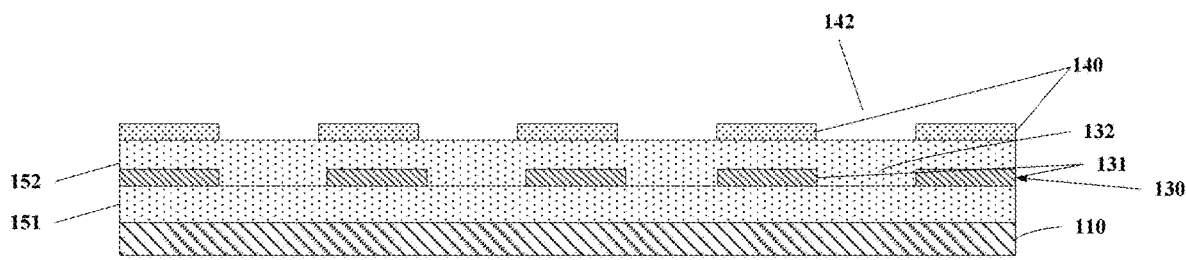
Fig. 5A
Fig. 5B

DISPLAY DEVICE AND MANUFACTURING METHOD THEREOF

CROSS-REFERENCE TO RELATED APPLICATIONS

The present application is a U.S. National Stage Application under 35 U.S.C. § 371 of International Patent Application No. PCT/CN2021/077895, filed on Feb. 25, 2021, the disclosure of which is incorporated by reference herein in its entirety.

TECHNICAL FIELD

The present disclosure relates to a display device and a manufacturing method thereof.

BACKGROUND

Currently, the under-screen imaging display technology has been increasingly applied in the display device such as a cell phone. In the under-screen imaging display technology, a front camera and all the sensors are hidden directly below the screen, so that there is no need to reserve a camera position on the screen by using a Notch Screen, and there is no need to use a lifting mechanical structure.

In the under-screen imaging display technology, a camera part of the display device comprises a display panel and an image collection device arranged below the display panel. The image collection device may collect an optical signal transmitted to the image collection device through the display panel, thereby realizing a camera function.

SUMMARY

According to an aspect of embodiments of the present disclosure, a display device is provided. The display device comprises: an imaging area and a display area on at least one side of the imaging area; the imaging area comprising: a substrate; an image collection device on a side of the substrate, the image collection device comprising a photosensitive element and an optical element between the photosensitive element and the substrate; a light blocking layer on a side of the substrate away from the image collection device, wherein the light blocking layer comprises at least one of a light absorbing layer or a diffuse reflection layer, and the light blocking layer is provided with a first gap; and a plurality of first electrodes on a side of the light blocking layer away from the substrate, wherein a second gap is provided between two adjacent first electrodes of the plurality of first electrodes, and each of the plurality of first electrodes is electrically connected to a pixel driving circuit located in the display area through a connection; wherein an orthographic projection of the light blocking layer on the substrate at least partially overlaps with an orthographic projection of the plurality of first electrodes on the substrate, and an orthographic projection of the first gap on the substrate at least partially overlaps with an orthographic projection of the second gap on the substrate.

In some embodiments, the orthographic projection of the light blocking layer on the substrate completely overlaps with the orthographic projection of the plurality of first electrodes on the substrate.

In some embodiments, the light blocking layer comprises a plurality of light blocking portions, wherein the first gap is provided between two adjacent light blocking portions of the plurality of light blocking portions, the plurality of light blocking portions are arranged in one-to-one correspondence to the plurality of first electrodes, an orthographic projection of each light blocking portion of the plurality of light blocking portions on the substrate completely overlaps with an orthographic projection of a first electrode of the plurality of first electrodes corresponding to the each light blocking portion on the substrate.

In some embodiments, the imaging area further comprises: a first planarization layer between the substrate and the light blocking layer; and a second planarization layer between the light blocking layer and the plurality of first electrodes, wherein the second planarization layer covers the light blocking layer.

In some embodiments, the light blocking layer is the light absorbing layer; and the light absorbing layer comprises a black matrix layer.

In some embodiments, the light blocking layer is the diffuse reflection layer; and the diffuse reflection layer comprises: a third planarization layer on a side of the first planarization layer away from the substrate, wherein a surface of the third planarization layer away from the substrate is a concave-convex surface, and a metal layer covering the concave-convex surface.

In some embodiments, the imaging area further comprises: a functional layer on a side of each of the plurality of first electrodes away from the substrate, the functional layer comprising a light emitting layer; a second electrode on a side of the functional layer away from the plurality of first electrodes; and an encapsulation layer on a side of the second electrode away from the functional layer.

According to another aspect of embodiments of the present disclosure, a manufacturing method for a display device is provided. The display device comprises an imaging area and a display area on at least one side of the imaging area. The manufacturing method comprises: forming a light blocking layer on a side of a substrate, wherein the light blocking layer comprises at least one of a light absorbing layer or a diffuse reflection layer, and the light blocking layer is provided with a first gap; forming a plurality of first electrodes on a side of the light blocking layer away from the substrate, wherein a second gap is provided between two adjacent first electrodes of the plurality of first electrodes, and each of the plurality of first electrodes is electrically connected to a pixel driving circuit located in the display area through a connection, an orthographic projection of the light blocking layer on the substrate at least partially overlaps with an orthographic projection of the plurality of first electrodes on the substrate, and an orthographic projection of the first gap on the substrate at least partially overlaps with an orthographic projection of the second gap on the substrate; and providing an image collection device on a side of the substrate away from the light blocking layer, the image collection device comprising a photosensitive element and an optical element between the photosensitive element and the substrate.

In some embodiments, the forming of the light blocking layer comprises: forming a first planarization layer on the substrate; forming a patterned light blocking layer on a side of the first planarization layer away from the substrate, wherein the light blocking layer comprises a plurality of light blocking portions, and the first gap is provided between two adjacent light blocking portions of the plurality of light blocking portions; and forming a second planarization layer on a side of the light blocking layer away from the first planarization layer, wherein the second planarization layer covers the light blocking layer.

In some embodiments, the light blocking layer is the light absorbing layer; and the light absorbing layer comprises a black matrix layer.

In some embodiments, the light blocking layer is the diffuse reflection layer; and the forming of the patterned light blocking layer on the side of the first planarization layer away from the substrate comprises: forming a third planarization layer on the side of the first planarization layer away from the substrate; photoetching the third planarization layer by using a half tone mask so as to pattern the third planarization layer, wherein after the third planarization layer is photoetched, a surface of the third planarization layer away from the substrate is formed as a concave-convex surface; and forming a metal layer covering the concave-convex surface.

In some embodiments, the manufacturing method further comprises: forming a functional layer on a side of each of the plurality of first electrodes away from the substrate, the functional layer comprising a light emitting layer; forming a second electrode on a side of the functional layer away from the plurality of first electrodes; and forming an encapsulation layer on a side of the second electrode away from the functional layer.

Other features and advantages of the present disclosure will become apparent from the following detailed description of exemplary embodiments of the present disclosure with reference to the accompanying drawings.

BRIEF DESCRIPTION OF THE DRAWINGS

The accompanying drawings which constitute part of this specification, illustrate the exemplary embodiments of the present disclosure, and together with this specification, serve to explain the principles of the present disclosure.

The present disclosure may be more explicitly understood from the following detailed description with reference to the accompanying drawings, in which:

FIG. 3 is a schematic cross-sectional view showing a diffuse reflection layer according to an embodiment of the present disclosure;

FIG. 4 is a flowchart showing a manufacturing method for a display device according to an embodiment of the present disclosure;

FIG. 5A is a schematic cross-sectional view showing a structure of one stage during a manufacturing process for a display device according to an embodiment of the present disclosure;

FIG. 5B is a schematic cross-sectional view showing a structure of another stage during the manufacturing process for the display device according to the embodiment of the present disclosure;

Figure 1A:
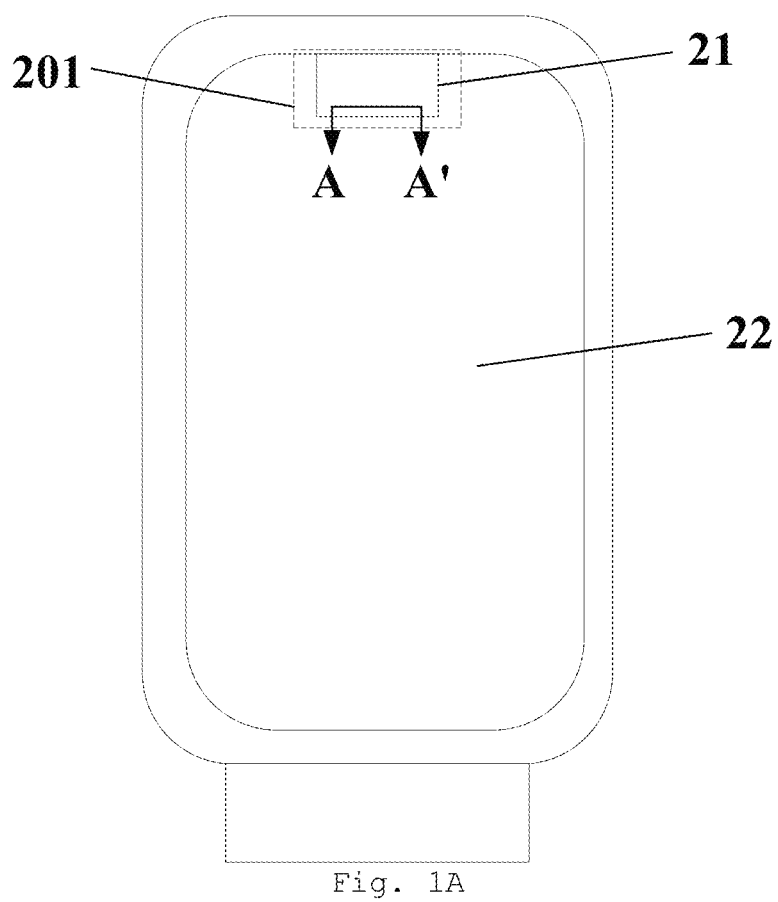
FIG. 1A is a top view showing a display device according to an embodiment of the present disclosure.

It should be understood that the dimensions of various parts shown in the accompanying drawings are not necessarily drawn according to actual proportional relations. In addition, the same or similar reference signs are used to denote the same or similar components.

DETAILED DESCRIPTION

Various exemplary embodiments of the present disclosure will now be described in detail in conjunction with the accompanying drawings. The description of the exemplary embodiments is merely illustrative and is in no way intended as a limitation to the present disclosure, its application or use. The present disclosure may be implemented in many different forms, which are not limited to the embodiments described herein. These embodiments are provided to make the present disclosure thorough and complete, and fully convey the scope of the present disclosure to those skilled in the art. It should be noticed that: relative arrangement of components and steps, material composition, numerical expressions, and numerical values set forth in these embodiments, unless specifically stated otherwise, should be explained as merely illustrative, and not as a limitation.

The use of the terms "first", "second" and similar words in the present disclosure do not denote any order, quantity or importance, but are merely used to distinguish between different parts. A word such as "comprise", "include", or the like means that the element before the word covers the element(s) listed after the word without excluding the possibility of also covering other elements. The terms "up", "down", "left", "right", or the like are used only to represent a relative positional relationship, and the relative positional relationship may be changed correspondingly if the absolute position of the described object changes.

In the present disclosure, when it is described that a particular device is located between the first device and the second device, there may be an intermediate device between the particular device and the first device or the second device, and alternatively, there may be no intermediate device. When it is described that a particular device is connected to other devices, the particular device may be directly connected to said other devices without an intermediate device, and alternatively, may not be directly connected to said other devices but with an intermediate device.

All the terms (comprising technical and scientific terms) used in the present disclosure have the same meanings as understood by those skilled in the art of the present disclosure unless otherwise defined. It should also be understood that terms as defined in general dictionaries, unless explicitly defined herein, should be interpreted as having meanings that are consistent with their meanings in the context of the relevant art, and not to be interpreted in an idealized or extremely formalized sense.

Techniques, methods, and apparatus known to those of ordinary skill in the relevant art may not be discussed in detail, but where appropriate, these techniques, methods, and apparatuses should be considered as part of this specification.

In the under-screen imaging display technology of the related art, an area corresponding to a camera retains an anode of the light emitting unit. The inventors of the present disclosure have found that, under irradiation by intense light, the light which is reciprocally reflected between the lens of the shot and the anode after passing through a hollowed-out area of the display panel, may form a noise shadow corresponding to a shape of the anode after reaching the photosensitive element, thereby affecting the imaging quality.

Figure 8A:
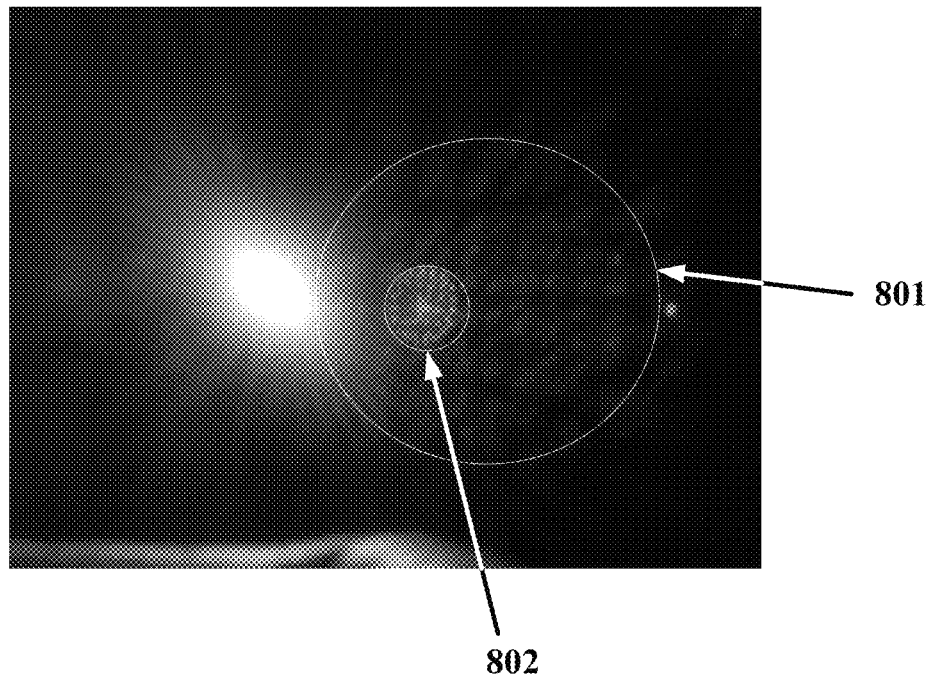
FIG. 8A is a schematic view showing a noise shadow appearing in an image when the image is captured with the light source directly facing a camera in the under-screen imaging display technology of the related art.
Figure 8B:
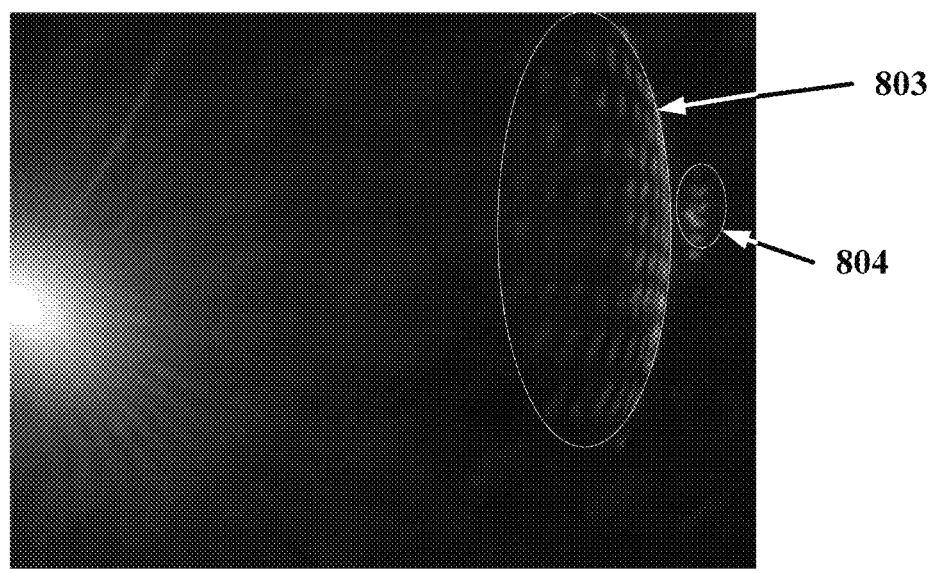
FIG. 8B is a schematic view showing a noise shadow appearing in an image when the image is captured with the light source obliquely entering a camera in the under-screen imaging display technology of the related art.

Since the camera has usually a plurality of lenses, for example, the camera has a first lens close to the display panel and a second lens on a side of the first lens away from the display panel, the intense light reflected between each lens and the anode might be captured by the photosensitive element for imaging so as to form multi-level noise shadows. For example, as shown in FIG. 8A, when the light source directly faces the camera, a first noise shadow area 801 corresponding to a shape of the anode caused by the first lens and a second noise shadow area 802 corresponding to a shape of the anode caused by the second lens may appear in the image. For another example, as shown in FIG. 8B, when the light source obliquely enters the camera to shoot, a third noise shadow area 803 corresponding to a shape of the anode caused by the first lens and a fourth noise shadow area 804 corresponding to a shape of the anode caused by the second lens may appear in the image.

In view of this, in the embodiments of the present disclosure, a display device is provided to reduce the above-described noise shadows. The display device according to some embodiments of the present disclosure will be described in detail below in conjunction with the accompanying drawings.

FIG. 1A is a top view showing a display device according to an embodiment of the present disclosure.

As shown in FIG. 1A, the display device comprises an imaging area 21 and a display area 22 on at least one side of the imaging area 21. For example, the display area 22 surrounds three sides of the imaging area 21. Here, the imaging area 21 is an area where the under-screen functional layer is arranged, that is, the back of the display panel corresponding to the area is provided with an image collection device. Since the imaging area 21 has a higher light transmittance, it is possible to meet the requirements for the light input of the under-screen camera and greatly increase the screen-to-body ratio of the display device.

Those skilled in the art can understand that, a specific position of the imaging area 21 may not be particularly required. For example, it may be flexibly selected according to actual design requirements of the under-screen functional layer. For example, the imaging area 21 is in the center of the display device, or at a corner of the display device, or at a center position of the display device proximate to an edge as shown in FIG. 1A. In addition, in the embodiments of the present disclosure, a shape of the imaging area 21 is not limited. For example, it may be a rectangle, a circle, or the like.

Figure 1B:
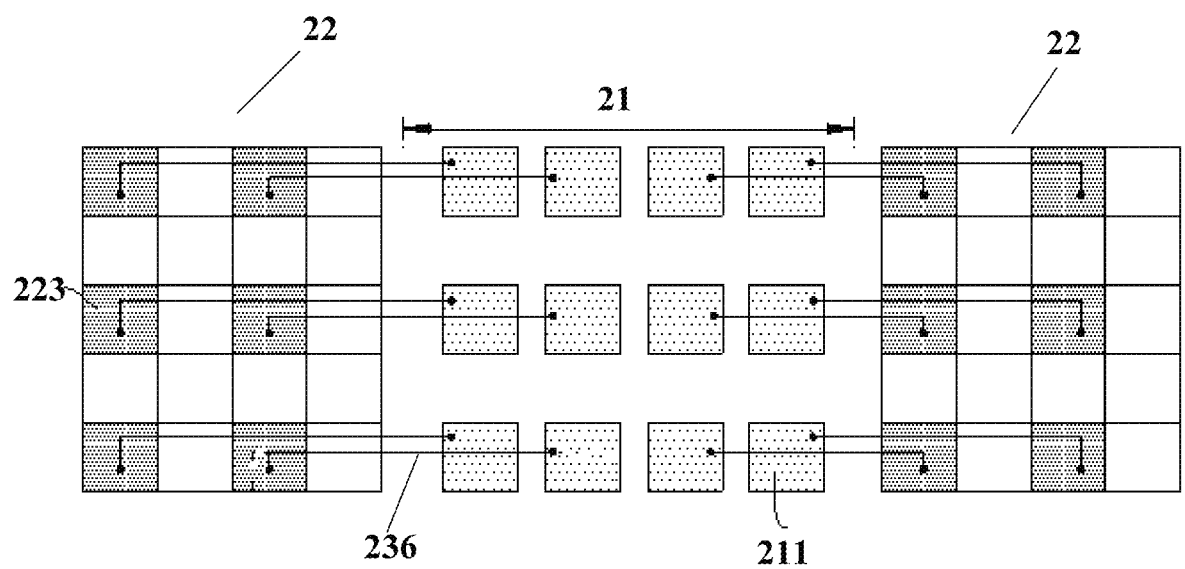
FIG. 1B is a partially enlarged schematic view showing the display device in FIG. 1A at a block 201.

FIG. 1B is a partially enlarged schematic view showing the display device in FIG. 1A at a block 201.

As shown in FIG. 1B, the imaging area 21 comprises a plurality of light emitting devices 211. The light emitting device 211 contains a light emitting layer and a first electrode (to be described later). The imaging area 21 is electrically connected to a pixel driving circuit 223 located in the display area 22. That is, the light emitting devices 211 in the imaging area 21 are electrically connected to the pixel driving circuits 223 located in the display area 22 in one-to-one correspondence. For example, as shown in FIG. 1B, the light emitting device 211 in the imaging area 21 is electrically connected to a corresponding pixel driving circuit 223 through a connection 236.

Figure 1C:
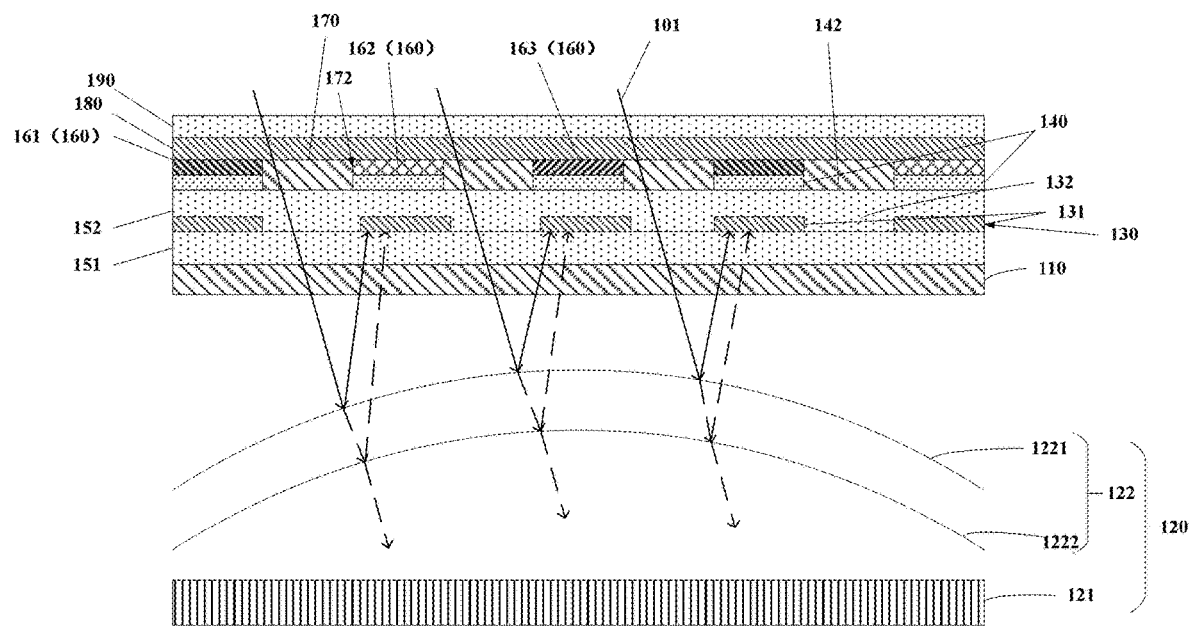
FIG. 1C is a schematic cross-sectional view showing a display device according to an embodiment of the present disclosure.

FIG. 1C is a schematic cross-sectional view showing a display device according to an embodiment of the present disclosure. This FIG. 1C is a schematic cross-sectional view of a structure taken along a line A-A' in FIG. 1A.

As shown in FIG. 1C, the imaging area 21 comprises a substrate 110. For example, a material of the substrate 110 comprises polyimide (referred to as PI for short).

As shown in FIG. 1C, the imaging area 21 further comprises an image collection device 120 on a side of the substrate 110. The image collection device 120 is arranged below the substrate 110. For example, the image collection device 120 comprises a photosensitive element 121 and an optical element 122 between the photosensitive element 121 and the substrate 110. For example, the photosensitive element 121 comprises a CCD (Charge Coupled Device) or a CMOS (Complementary Metal Oxide Semiconductor). In some embodiments, as shown in FIG. 1C, the optical element 122 comprises a first optical element 1221 close to the substrate and a second optical element 1222 between the first optical element 1221 and the photosensitive element 121. For example, the first optical element 1221 and the second optical element 1222 are both lenses.

As shown in FIG. 1C, the imaging area 21 further comprises a light blocking layer 130 on a side of the substrate 110 away from the image collection device 120. The light blocking layer 130 comprises at least one of a light absorbing layer or a diffuse reflection layer. For example, in the embodiment shown in FIG. 1C, the light blocking layer 130 is the light absorbing layer. For example, the light absorbing layer comprises a black matrix (referred to as BM for short) layer. For example, a material of the black matrix layer comprises Cr (chromium), chromium oxide, black resin, or the like. As shown in FIG. 1C, the light blocking layer 130 is provided with a first gap 132.

As shown in FIG. 1C, the imaging area 21 further comprises a plurality of first electrodes 140 on a side of the light blocking layer 130 away from the substrate 110. A second gap 142 is provided between two adjacent first electrodes 140 of the plurality of first electrodes 140. For example, the first electrode is an anode of an OLED (Organic Light Emitting Diode) display device. Each of the plurality of first electrodes 140 is electrically connected to the pixel driving circuit 223 located in the display area 22 through the connection 236.

In some embodiments, the above-described connection 236 is located below the light blocking layer 130, so that the light blocking layer 130 is close to the first electrode as much as possible, so as to achieve a better light blocking effect. The connection 236 is connected to the first electrode 140 through a via hole passing through a planarization layer (for example, a first planarization layer 151 and a second planarization layer 152 to be described later). Of course, the scope of the embodiments of the present disclosure is not limited to this. For example, the above-described connection 236 may also be located above the light blocking layer 130.

An orthographic projection of the light blocking layer 130 on the substrate 110 at least partially overlaps with an orthographic projection of the plurality of first electrodes 140 on the substrate 110. An orthographic projection of the first gap 132 on the substrate 110 at least partially overlaps with an orthographic projection of the second gap 142 on the substrate.

For example, the first gap 132 is aligned with the second gap 142. That is, the orthographic projection of the first gap 132 on the substrate 110 completely overlaps with the orthographic projection of the second gap 142 on the substrate.

The principles of reducing a noise shadow of the above-described display device will be described below in conjunction with light 101.

As shown in FIG. 1C, the light 101 is incident to the first optical element 1221 through the second gap 142 and the first gap 132. A part of the light 101 is directly reflected by the first optical element 1221 onto the light blocking layer 130, while another part of the light is incident to the second optical element 1222 through the first optical element 1221 and is reflected by the second optical element 1222 onto the light blocking layer 130. In the case that the light blocking layer 130 is the light absorbing layer, the light that reaches the light blocking layer 130 may be absorbed, so that the light may not be irradiated onto the first electrode 140, and may not be reflected by the first electrode 140 onto the photosensitive element 121 as well. In this way, it is possible to reduce the formation of a noise shadow corresponding to a shape of the first electrode, thereby improving the imaging quality of the display device.

So far, the display device according to some embodiments of the disclosure is provided. The display device comprises: a substrate; an image collection device on a side of the substrate; a light blocking layer on a side of the substrate away from the image collection device, wherein the light blocking layer comprises at least one of a light absorbing layer or a diffuse reflection layer, and the light blocking layer is provided with a first gap; and a plurality of first electrodes on a side of the light blocking layer away from the substrate, wherein a second gap is provided between two adjacent first electrodes of the plurality of first electrodes. An orthographic projection of the light blocking layer on the substrate at least partially overlaps with an orthographic projection of the plurality of first electrodes on the substrate, an orthographic projection of the first gap on the substrate at least partially overlaps with an orthographic projection of the second gap on the substrate. In the embodiment, the light blocking layer is provided at a corresponding position below the first electrode, such that it is possible to reduce or even eliminate reflection of stray light between the image collection device and the first electrode by way of the light absorbing function or diffuse reflection function of the light blocking layer (to be described later), thereby reducing the formation of the noise shadow corresponding to the shape of the first electrode, and improving the imaging quality of the display device. The first electrode may be a part of the OLED circuit layer.

In some embodiments, the orthographic projection of the light blocking layer 130 on the substrate completely overlaps with the orthographic projection of the plurality of first electrodes 140 on the substrate. In this way, it is possible to further reduce the formation of the noise shadow corresponding to the shape of the first electrode.

In some embodiments, as shown in FIG. 1C, the light blocking layer 130 comprises a plurality of light blocking portions 131. The first gap 132 is provided between two adjacent light blocking portions 131 of the plurality of light blocking portions 131. The plurality of light blocking portions 131 are arranged in one-to-one correspondence to the plurality of first electrodes 140. An orthographic projection of each light blocking portion of the plurality of light blocking portions 131 on the substrate 110 completely overlaps with an orthographic projection of a first electrode of the plurality of first electrodes 140 corresponding to the each light blocking portion on the substrate. For example, an area of a surface of each light blocking portion 131 that is parallel to the substrate 110 is equal to an area of a surface of the first electrode 140 corresponding to the each light blocking portion 131 that is parallel to the substrate 110. In this embodiment, it is not only convenient for light to enter the image collection device through the second gap and the first gap to achieve the image collection, but also possible to allow that the light blocking portion adequately blocks the light reflected by the optical element, thereby reducing the formation of the noise shadow corresponding to the shape of the first electrode.

In some embodiments, as shown in FIG. 1C, the imaging area 21 further comprises a first planarization layer 151 between the substrate 110 and the light blocking layer 130, and a second planarization layer 152 between the light blocking layer 130 and the plurality of first electrodes 140. The second planarization layer 152 covers the light blocking layer 130. For example, materials of the first planarization layer 151 and the second planarization layer 152 each comprise an organic insulating material such as resin.

In some embodiments, as shown in FIG. 1C, the imaging area 21 further comprises a functional layer 160 on a side of each of the plurality of first electrodes 140 away from the substrate 110. The functional layer 160 comprises a light emitting layer 161, 162, or 163. For example, the light emitting layer 161 (which may be referred to as a first light emitting layer) is a light emitting layer with a red light emitting color, the light emitting layer 162 (which may be referred to as a second light emitting layer) is a light emitting layer with a green light emitting color, and the light emitting layer 163 (which may be referred to as a third light emitting layer) is a light emitting layer with a blue light emitting color.

For example, the imaging area 21 further comprises a pixel defining layer 170 on a side of the second planarization layer 152 away from the substrate. The pixel defining layer 170 fills the second gap 142, and the pixel defining layer 170 has an opening 172 exposing at least a portion of the first electrode 140. The light emitting layer 161, 162, or 163 is in a corresponding opening 172.

Of course, those skilled in the art can understand that, in some embodiments, in addition to the light emitting layer, the functional layer 160 may further comprise a carrier transport layer and the like which will not be described in detail here.

In some embodiments, as shown in FIG. 1C, the imaging area further comprises a second electrode 180 on a side of the functional layer 160 away from the plurality of first electrodes 140. For example, the second electrode 180 is a cathode.

In some embodiments, as shown in FIG. 1C, the imaging area 21 further comprises an encapsulation layer 190 on a side of the second electrode 180 away from the functional layer 160. For example, the encapsulation layer 190 comprises at least one of an inorganic encapsulation layer or an organic encapsulation layer.

Figure 2:
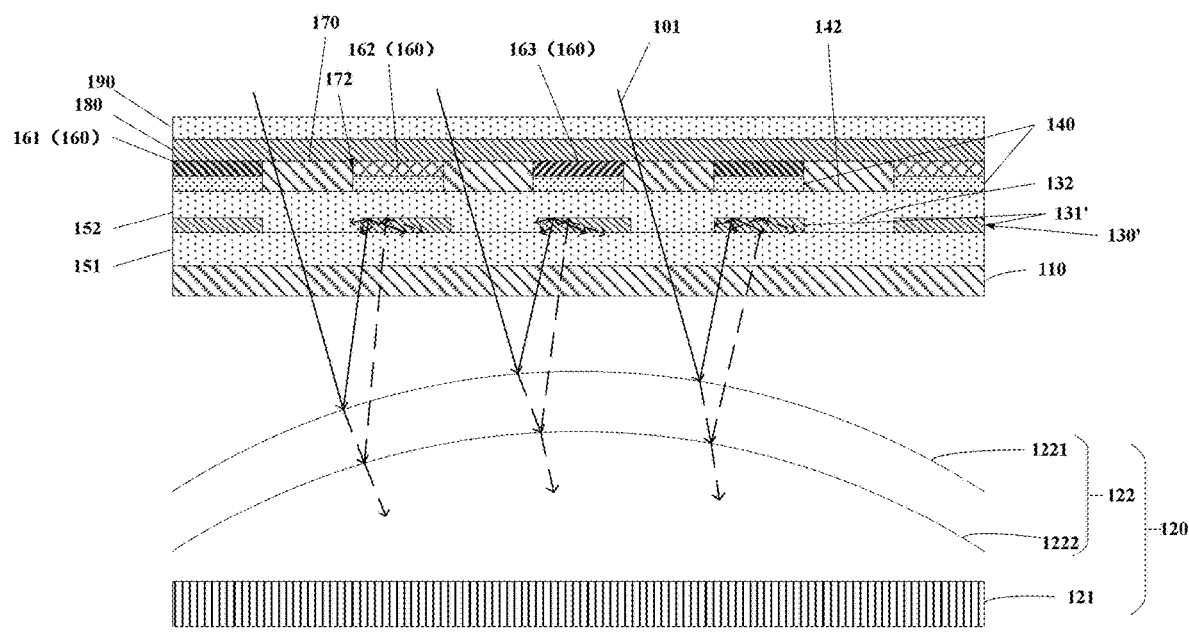
FIG. 2 is a schematic cross-sectional view showing a display device according to another embodiment of the present disclosure.

FIG. 2 is a schematic cross-sectional view showing a display device according to another embodiment of the present disclosure.

Here, a structure of the display device shown in FIG. 2 is similar to a structure of the display device shown in FIG. 1C. The structure of the display device shown in FIG. 2 that is the same as or similar to the structure of the display device shown in FIG. 1C will not be described in detail.

Different from the display device shown in FIG. 1C, a light blocking layer 130' in the display device shown in FIG. 2 is a diffuse reflection layer. The diffuse reflection layer comprises a plurality of light blocking portions 131'.

The principles of reducing a noise shadow in the display device shown in FIG. 2 will be described below in conjunction with light 101.

As shown in FIG. 2, the light 101 is incident to the first optical element 1221 through the second gap 142 and the first gap 132. A part of the light 101 is directly reflected by the first optical element 1221 onto the light blocking layer 130'. Another part of the light 101 is incident to the second optical element 1222 through the first optical element 1221 and is reflected by the second optical element 1222 onto the light blocking layer 130'. In the case that the light blocking layer 130' is the diffuse reflection layer, the light reaching the light blocking layer 130' may be diffusely reflected, so that these light may not be irradiated onto the first electrode 140, and may not be reflected by the first electrode 140 onto the photosensitive element 121. In this way, it is possible to reduce a noise shadow corresponding to a shape of the first electrode, thereby improving the imaging quality of the display device.

It should be noted that, although FIG. 1C shows an embodiment in which the light blocking layer is a light absorbing layer, and FIG. 2 shows an embodiment in which the light blocking layer is a diffuse reflection layer, the scope of the present disclosure is not limited to this. For example, the light blocking layer may comprise a light absorbing layer and a diffuse reflection layer. That is, a part of the light blocking portions of the light blocking layer are the light absorbing layer, and another part of the light blocking portions of the light blocking layer are the diffuse reflection layer. In this way, a suitable light blocking effect of the light blocking layer can be achieved according to different positions of the first electrodes.

FIG. 3 is a schematic cross-sectional view showing a diffuse reflection layer according to an embodiment of the present disclosure.

Here, the light blocking layer 130' is a diffuse reflection layer 130'. In some embodiments, as shown in FIGS. 2 and 3, the diffuse reflection layer 130' (for example, a light blocking portion 131' of the diffuse reflection layer 130') comprises a third planarization layer 1311' on a side of the first planarization layer 151 away from the substrate 110. That is, the third planarization layer 1311' is on the first planarization layer 151. A surface of the third planarization layer 1311' away from the substrate 110 is a concave-convex surface 13102'. The concave-convex surface is a surface with a certain roughness. The diffuse reflection layer 130' also comprises a metal layer 1312' covering the concave-convex surface 13102'. For example, a material of the third planarization layer 1311' comprises an organic insulating material such as resin. For example, a material of the metal layer 1312' comprises Al (aluminum), Mo (molybdenum), Ti (titanium), or the like.

It may be seen from FIG. 3 that the surface of the diffuse reflection layer 130' away from the substrate 110 (that is, an upper surface of the diffuse reflection layer 130') is the concave-convex surface 13102', so that the metal layer 1312' covering the concave-convex surface 13102' has a diffuse reflection surface. When light is incident to the diffuse reflection layer 130' from below the diffuse reflection layer 130', the light may be diffusely reflected by the diffuse reflection surface of the metal layer 1312', so that the light may not be irradiated onto the first electrode 140 as shown in FIG. 2, thereby reducing the formation of the noise shadow corresponding to the shape of the first electrode.

FIG. 4 is a flowchart showing a manufacturing method for a display device according to an embodiment of the present disclosure. The display device comprises an imaging area and a display area on at least one side of the imaging area. As shown in FIG. 4, the manufacturing method comprises steps S402 to S406. The manufacturing method shown in FIG. 4 describes the manufacturing process of the imaging area.

In step S402, a light blocking layer is formed on a side of a substrate, wherein the light blocking layer comprises at least one of a light absorbing layer or a diffuse reflection layer, and the light blocking layer is provided with a first gap.

In step S404, a plurality of first electrodes are formed on a side of the light blocking layer away from the substrate, wherein a second gap is provided between two adjacent first electrodes of the plurality of first electrodes. Each of the plurality of first electrodes is electrically connected to a pixel driving circuit located in the display area through a connection. An orthographic projection of the light blocking layer on the substrate at least partially overlaps with an orthographic projection of the plurality of first electrodes on the substrate. An orthographic projection of the first gap on the substrate at least partially overlaps with an orthographic projection of the second gap on the substrate.

In step S406, an image collection device is provided on a side of the substrate away from the light blocking layer. The image collection device comprises a photosensitive element and an optical element between the photosensitive element and the substrate.

So far, a manufacturing method for a display device according to some embodiments of the present disclosure is provided. By way of the manufacturing method, a light blocking layer is formed between the first electrode and the image collection device. Therefore, it is possible to reduce the formation of a noise shadow corresponding to a shape of the first electrode, thereby improving the imaging quality of the display device.

FIGS. 5A to 5D are schematic cross-sectional views showing structures of several stages during a manufacturing process of a display device according to some embodiments of the present disclosure. The manufacturing process of the imaging area of the display device according to some embodiments of the present disclosure will be described in detail below in conjunction with FIGS. 5A to 5D and FIG. 1C.

First, as shown in FIG. 5A, a first planarization layer 151 is formed on a substrate 110, for example by a coating process.

Next, as shown in FIG. 5A, a patterned light blocking layer 130 is formed on a side of the first planarization layer 151 away from the substrate 110, for example by a deposition and patterning (for example, a mask exposure method) process. The light blocking layer 130 comprises a plurality of light blocking portions 131. A first gap 132 is provided between two adjacent light blocking portions 131 of the plurality of light blocking portions 131. For example, the light blocking layer is a light absorbing layer. For example, the light absorbing layer comprises a black matrix layer.

Next, as shown in FIG. 5A, a second planarization layer 152 is formed on a side of the light blocking layer 130 away from the first planarization layer 151, for example by a coating process. The second planarization layer 152 covers the light blocking layer 130.

So far, the step of forming the light blocking layer 130 is completed.

Next, as shown in FIG. 5B, a plurality of first electrodes 140 are formed on a side of the light blocking layer 130 away from the substrate 110, for example by a deposition and patterning process. The plurality of first electrodes 140 are formed on the second planarization layer 152. A second gap 142 is provided between two adjacent first electrodes of the plurality of first electrodes 140.

Figure 5C:
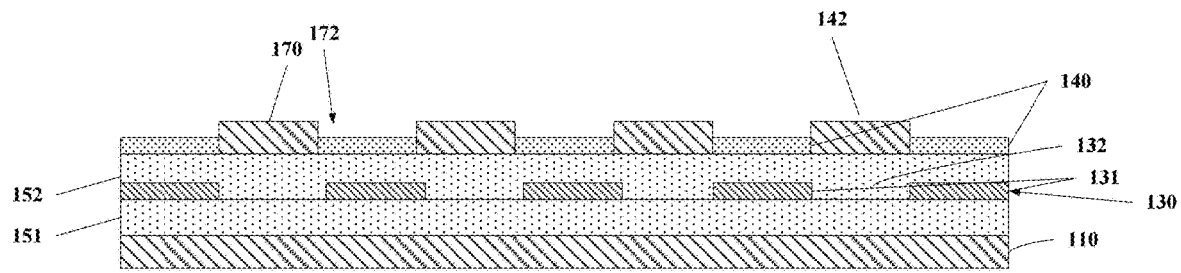
FIG. 5C is a schematic cross-sectional view showing a structure of another stage during the manufacturing process for the display device according to the embodiment of the present disclosure.

Next, as shown in FIG. 5C, a pixel defining layer 170 is formed on a side of the second planarization layer 152 away from the substrate 110. The pixel defining layer 170 fills the second gap 142. The pixel defining layer 170 has an opening 172 exposing at least a portion of the first electrode 140.

Figure 5D:
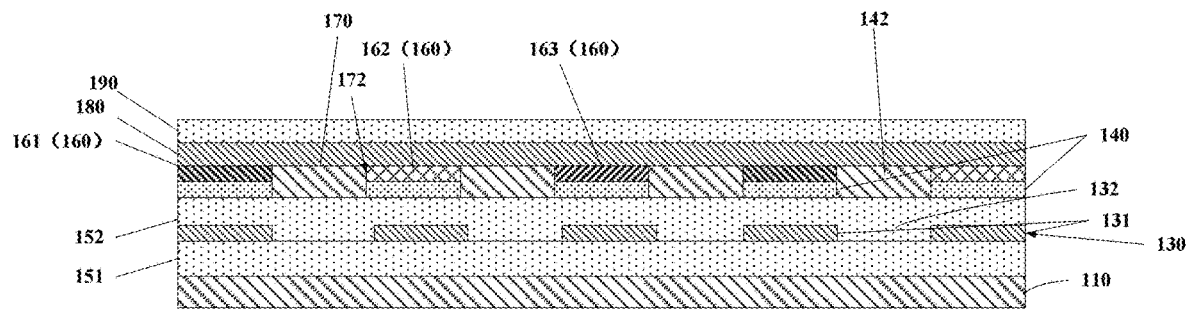
FIG. 5D is a schematic cross-sectional view showing a structure of another stage during the manufacturing process for the display device according to the embodiment of the present disclosure.

Next, as shown in FIG. 5D, a functional layer 160 is formed on a side of each of the plurality of first electrodes 140 away from the substrate 110. The functional layer 160 comprises a light emitting layer 161, 162, or 163. The light emitting layer 161, 162, or 163 is in a corresponding opening 172.

Next, as shown in FIG. 5D, a second electrode 180 is formed on a side of the functional layer 160 away from the plurality of first electrodes 140, for example by a deposition process.

Next, as shown in FIG. 5D, an encapsulation layer 190 is formed on a side of the second electrode 180 away from the functional layer 160, for example by a deposition process.

So far, the display panel as shown in FIG. 5D is formed.

Next, as shown in FIG. 1C, an image collection device 120 is provided on a side of the substrate 110 away from the light blocking layer 130. That is, the display panel shown in FIG. 5D and the image collection device 120 are assembled together to form the display device shown in FIG. 1C.

So far, the manufacturing method for the display device according to some embodiments of the present disclosure is provided. In the display device formed by the manufacturing method, the light blocking layer is located below the first electrode. The reflection of stray light between the image collection device and the first electrode is reduced (or even eliminated) by the light absorbing function of the light blocking layer, thereby reducing the formation of a noise shadow corresponding to a shape of the first electrode, and improving the imaging quality of the display device.

FIGS. 6A to 6D are schematic cross-sectional views showing structures of several stages during a manufacturing process of a display device according to other embodiments of the present disclosure. The manufacturing process of the imaging area of the display device according to other embodiments of the present disclosure will be described in detail below in conjunction with FIGS. 6A to 6D and FIG. 2.

Figure 6A:
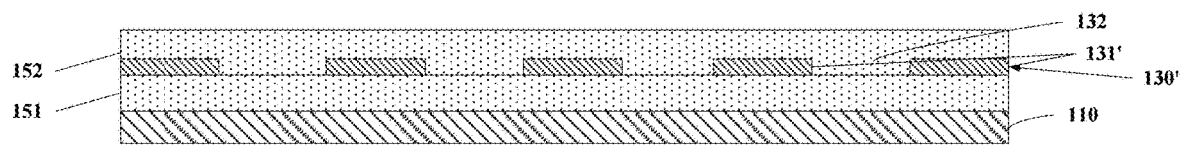
FIG. 6A is a schematic cross-sectional view showing a structure of one stage during a manufacturing process for a display device according to another embodiment of the present disclosure.

First, as shown in FIG. 6A, a first planarization layer 151 is formed on a substrate 110, for example by a coating process.

Next, as shown in FIG. 6A, a patterned light blocking layer 130' is formed on a side of the first planarization layer 151 away from the substrate 110. The light blocking layer 130' comprises a plurality of light blocking portions 131'. A first gap 132 is provided between two adjacent light blocking portions 131' of the plurality of light blocking portions 131'. For example, the light blocking layer is a diffuse reflection layer. A process of forming the diffuse reflection layer will be described in detail later in conjunction with FIGS. 7A to 7C.

Next, as shown in FIG. 6A, a second planarization layer 152 is formed on a side of the light blocking layer 130' away from the first planarization layer 151, for example by a coating process. The second planarization layer 152 covers the light blocking layer 130'.

Figure 6B:
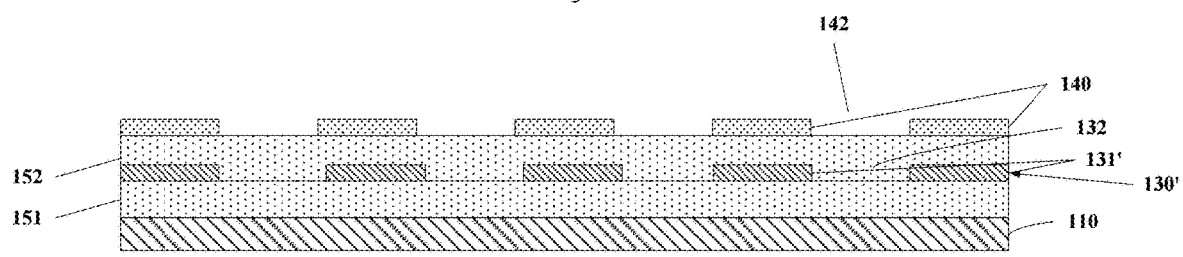
FIG. 6B is a schematic cross-sectional view showing a structure of another stage during the manufacturing process for the display device according to another embodiment of the present disclosure.

Next, as shown in FIG. 6B, a plurality of first electrodes 140 are formed on a side of the light blocking layer 130' away from the substrate 110, for example by a deposition and patterning process. For example, the plurality of first electrodes 140 are formed on the second planarization layer 152. A second gap 142 is provided between two adjacent first electrodes of the plurality of first electrodes 140.

Figure 6C:
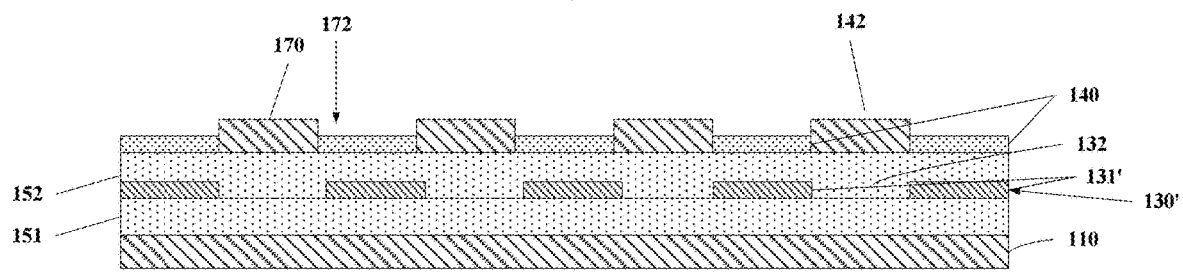
FIG. 6C is a schematic cross-sectional view showing a structure of another stage during the manufacturing process for the display device according to another embodiment of the present disclosure.

Next, as shown in FIG. 6C, a pixel defining layer 170 is formed on a side of the second planarization layer 152 away from the substrate 110. The pixel defining layer 170 fills the second gap 142. The pixel defining layer 170 has an opening 172 exposing at least a portion of the first electrode 140.

Figure 6D:
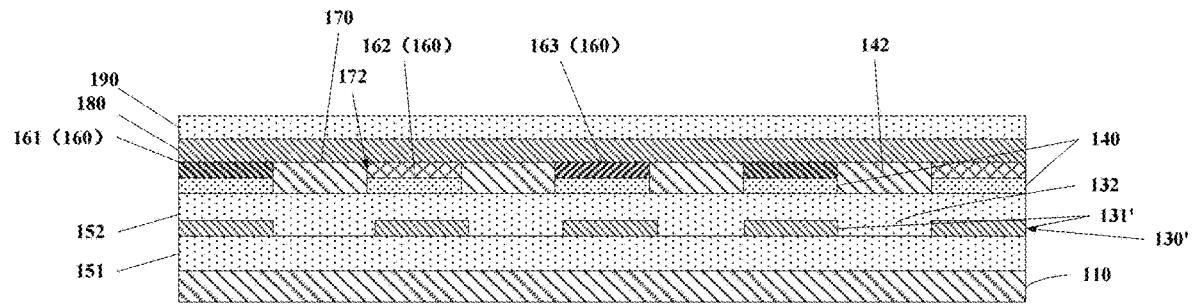
FIG. 6D is a schematic cross-sectional view showing a structure of another stage during the manufacturing process for the display device according to another embodiment of the present disclosure.

Next, as shown in FIG. 6D, a functional layer 160 is formed on a side of each of the plurality of first electrodes 140 away from the substrate 110. The functional layer 160 comprises a light emitting layer 161, 162, or 163. The light emitting layer 161, 162, or 163 is in a corresponding opening 172.

Next, as shown in FIG. 6D, a second electrode 180 is formed on a side of the functional layer 160 away from the plurality of first electrodes 140, for example by a deposition process.

Next, as shown in FIG. 6D, an encapsulation layer 190 is formed on a side of the second electrode 180 away from the functional layer 160, for example by a deposition process.

So far, the display panel as shown in FIG. 6D is formed.

Next, as shown in FIG. 2, an image collection device 120 is provided on a side of the substrate 110 away from the light blocking layer 130'. That is, the display panel shown in FIG. 6D and the image collection device 120 are assembled together to form the display device shown in FIG. 2.

So far, the manufacturing method for the display device according to some embodiments of the present disclosure is provided. In the display device formed by the manufacturing method, the light blocking layer is below the first electrode. The reflection of stray light between the image collection device and the first electrode is reduced (or even eliminated) by the diffuse reflection function of the light blocking layer, thereby reducing the formation of the noise shadow corresponding to the shape of the first electrode, and improving the imaging quality of the display device.

Figure 7A:
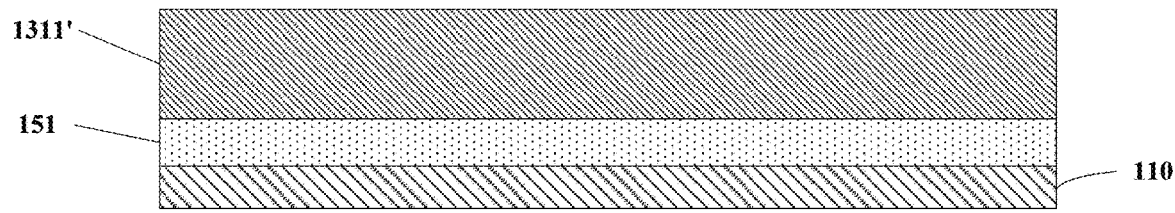
FIG. 7A is a schematic cross-sectional view showing a structure of one stage during a manufacturing process for a diffuse reflection layer according to an embodiment of the present disclosure.
Figure 7B:
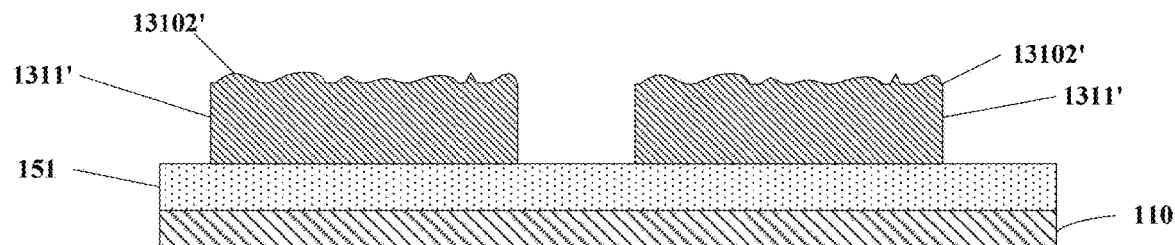
FIG. 7B is a schematic cross-sectional view showing a structure of another stage during the manufacturing process for the diffuse reflection layer according to the embodiment of the present disclosure.
Figure 7C:
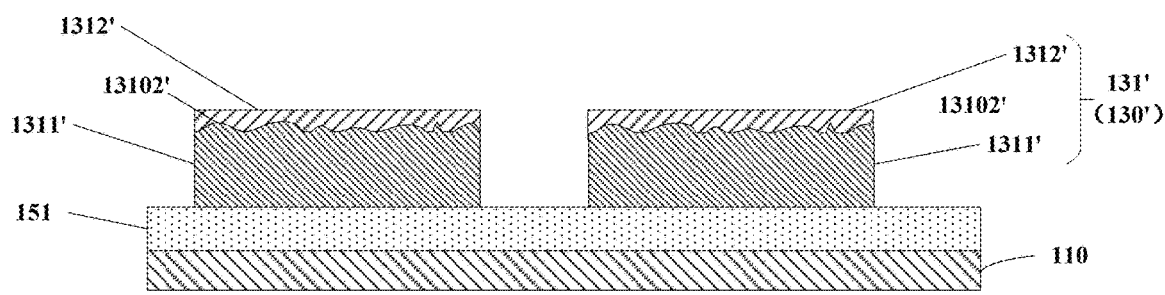
FIG. 7C is a schematic cross-sectional view showing a structure of another stage during the manufacturing process for the diffuse reflection layer according to the embodiment of the present disclosure.

FIGS. 7A to 7C are schematic cross-sectional views showing structures of several stages during a manufacturing process of a diffuse reflection layer according to some embodiments of the present disclosure. The manufacturing method for the diffuse reflection layer according to some embodiments of the present disclosure will be described in detail below in conjunction with FIGS. 7A to 7C.

First, as shown in FIG. 7A, a third planarization layer 1311' is formed on a side of the first planarization layer 151 away from the substrate 110, for example by a coating process. That is, the third planarization layer 1311' is formed on the first planarization layer 151.

Next, as shown in FIG. 7B, the third planarization layer 1311' is photoetched by using a half tone mask so as to pattern the third planarization layer 1311'. After the third planarization layer 1311' is photoetched, a surface of the third planarization layer 1311' away from the substrate 110 (that is, an upper surface of the third planarization layer 1311') is formed as a concave-convex surface 13102'.

Next, as shown in FIG. 7B, a metal layer 1312' covering the concave-convex surface 13102' is formed, for example by a sputtering process.

So far, the manufacturing process for the diffuse reflection layer according to some embodiments of the present disclosure is provided.

In the above-described embodiments, the third planarization layer is subjected to light exposure using the half tone mask so as to form a microscopic concave-convex topography on the surface of the third planarization layer, and then a metal layer is formed on the surface of the concave-convex topography. In some embodiments, diffuse reflection layers with different morphologies and different reflectivities may be obtained by controlling the process parameters such as a graphic design and an exposure speed of the half tone mask.

The above-described diffuse reflection layer may diffusely reflect the light irradiated thereon. When the diffuse reflection layer is applied to the display device as a light blocking layer, it is possible to reduce the formation of a noise shadow corresponding to a shape of the first electrode, thereby improving the imaging quality of the display device.

Hereto, various embodiments of the present disclosure have been described in detail. Some details well known in the art are not described in order to avoid obscuring the concept of the present disclosure. According to the above description, those skilled in the art would fully understand how to implement the technical solutions disclosed here.

Although some specific embodiments of the present disclosure have been described in detail by way of examples, those skilled in the art should understand that the above examples are only for the purpose of illustration and are not intended to limit the scope of the present disclosure. It should be understood by those skilled in the art that modifications to the above embodiments or equivalently substitution of part of the technical features may be made without departing from the scope and spirit of the present disclosure. The scope of the present disclosure is defined by the appended claims.

What is claimed is:

1. A display device, comprising: an imaging area and a display area on at least one side of the imaging area;
the imaging area comprising:
a substrate;
an image collection device on a side of the substrate, the image collection device comprising a photosensitive element and an optical element between the photosensitive element and the substrate;
a light blocking layer on a side of the substrate away from the image collection device, wherein the light blocking layer comprises at least one of a light absorbing layer or a diffuse reflection layer, and the light blocking layer is provided with a first gap; and
a plurality of first electrodes on a side of the light blocking layer away from the substrate, wherein a second gap is provided between two adjacent first electrodes of the plurality of first electrodes, and each of the plurality of first electrodes is electrically connected to a pixel driving circuit located in the display area through a connection;
wherein an orthographic projection of the light blocking layer on the substrate at least partially overlaps with an orthographic projection of the plurality of first electrodes on the substrate, and an orthographic projection of the first gap on the substrate at least partially overlaps with an orthographic projection of the second gap on the substrate;
wherein the imaging area further comprises:
a functional layer on a side of each of the plurality of first electrodes away from the substrate, the functional layer comprising a light emitting layer;
a second electrode on a side of the functional layer away from the plurality of first electrodes; and
an encapsulation layer on a side of the second electrode away from the functional layer.

2. The display device according to claim 1, wherein the orthographic projection of the light blocking layer on the substrate completely overlaps with the orthographic projection of the plurality of first electrodes on the substrate.

3. The display device according to claim 1, wherein:
the light blocking layer comprises a plurality of light blocking portions, wherein the first gap is provided between two adjacent light blocking portions of the plurality of light blocking portions, the plurality of light blocking portions are arranged in one-to-one correspondence to the plurality of first electrodes, an orthographic projection of each light blocking portion of the plurality of light blocking portions on the substrate completely overlaps with an orthographic projection of a first electrode of the plurality of first electrodes corresponding to the each light blocking portion on the substrate.

4. The display device according to claim 1, wherein the imaging area further comprises:
a first planarization layer between the substrate and the light blocking layer; and
a second planarization layer between the light blocking layer and the plurality of first electrodes, wherein the second planarization layer covers the light blocking layer.

5. The display device according to claim 4, wherein:
the light blocking layer is the diffuse reflection layer; and
the diffuse reflection layer comprises:
a third planarization layer on a side of the first planarization layer away from the substrate, wherein a surface of the third planarization layer away from the substrate is a concave-convex surface, and
a metal layer covering the concave-convex surface.

6. The display device according to claim 1, wherein:
the light blocking layer is the light absorbing layer; and
the light absorbing layer comprises a black matrix layer.

7. A manufacturing method for a display device, the display device comprising an imaging area and a display area on at least one side of the imaging area, the manufacturing method comprising:
> forming a light blocking layer on a side of a substrate, wherein the light blocking layer comprises at least one of a light absorbing layer or a diffuse reflection layer, and the light blocking layer is provided with a first gap;
> forming a plurality of first electrodes on a side of the light blocking layer away from the substrate, wherein a second gap is provided between two adjacent first electrodes of the plurality of first electrodes, and each of the plurality of first electrodes is electrically connected to a pixel driving circuit located in the display area through a connection, an orthographic projection of the light blocking layer on the substrate at least partially overlaps with an orthographic projection of the plurality of first electrodes on the substrate, and an orthographic projection of the first gap on the substrate at least partially overlaps with an orthographic projection of the second gap on the substrate;
> providing an image collection device on a side of the substrate away from the light blocking layer, the image collection device comprising a photosensitive element and an optical element between the photosensitive element and the substrate; and
> forming a functional layer on a side of each of the plurality of first electrodes away from the substrate, the functional layer comprising a light emitting layer;
> forming a second electrode on a side of the functional layer away from the plurality of first electrodes; and
> forming an encapsulation layer on a side of the second electrode away from the functional layer.

8. The manufacturing method according to claim 7, wherein the forming of the light blocking layer comprises:
> forming a first planarization layer on the substrate;
> forming a patterned light blocking layer on a side of the first planarization layer away from the substrate, wherein the light blocking layer comprises a plurality of light blocking portions, and the first gap is provided between two adjacent light blocking portions of the plurality of light blocking portions; and
> forming a second planarization layer on a side of the light blocking layer away from the first planarization layer, wherein the second planarization layer covers the light blocking layer.

9. The manufacturing method according to claim 8, wherein:
> the light blocking layer is the diffuse reflection layer; and
> the forming of the patterned light blocking layer on the side of the first planarization layer away from the substrate comprises:
> forming a third planarization layer on the side of the first planarization layer away from the substrate;
> photoetching the third planarization layer by using a half tone mask so as to pattern the third planarization layer, wherein after the third planarization layer is photoetched, a surface of the third planarization layer away from the substrate is formed as a concave-convex surface; and
> forming a metal layer covering the concave-convex surface.

10. The manufacturing method according to claim 7, wherein:
> the light blocking layer is the light absorbing layer; and
> the light absorbing layer comprises a black matrix layer.

* * * * *